(12) United States Patent
Mori (10) Patent No.: US 7,282,098 B2
(45) Date of Patent: *Oct. 16, 2007

(54) PROCESSING-SUBJECT CLEANING METHOD AND APPARATUS, AND DEVICE MANUFACTURING METHOD AND DEVICE

(75) Inventor: Yoshiaki Mori, Suwa-gun (JP)

(73) Assignee: Seiko Epson Corporation, Tokyo (JP)

( * ) Notice: Subject to any disclaimer, the term of this patent is extended or adjusted under 35 U.S.C. 154(b) by 512 days.

This patent is subject to a terminal disclaimer.

(21) Appl. No.: 10/366,664

(22) Filed: Feb. 14, 2003

(65) Prior Publication Data

US 2004/0079387 A1 Apr. 29, 2004

(30) Foreign Application Priority Data

Mar. 15, 2002 (JP) ............................. 2002-073071

(51) Int. Cl.
B08B 5/04 (2006.01)
(52) U.S. Cl. ............................. 134/21; 134/1; 134/1.3; 134/26; 134/34; 134/36; 438/906
(58) Field of Classification Search .................. 134/21, 134/34, 26, 36, 902, 1, 1.3; 438/704, 669, 438/677, 745, 906
See application file for complete search history.

(56) References Cited

U.S. PATENT DOCUMENTS

| | | | |
|---|---|---|---|
| 6,253,462 B1 * | 7/2001 | Schwarz | 34/348 |
| 6,365,531 B1 | 4/2002 | Hayashi et al. | |
| 6,457,478 B1 * | 10/2002 | Danese | 134/1.3 |
| 6,488,040 B1 * | 12/2002 | de Larios et al. | 134/95.2 |
| 6,599,582 B2 | 7/2003 | Kiguchi et al. | |
| 6,616,772 B2 * | 9/2003 | de Larios et al. | 134/21 |
| 6,730,176 B2 * | 5/2004 | Kuyel | 134/1 |
| 2003/0102013 A1 * | 6/2003 | Jackson | 134/21 |
| 2004/0082183 A1 * | 4/2004 | Mori | 438/704 |

FOREIGN PATENT DOCUMENTS

| | | | |
|---|---|---|---|
| EP | 0 587 889 A1 | | 3/1994 |
| JP | 62150828 | * | 7/1987 |
| JP | A-62-188322 | | 8/1987 |
| JP | A-01-226156 | | 9/1989 |
| JP | 402150028 | * | 6/1990 |
| JP | 03058417 | * | 3/1991 |
| JP | A-04-354334 | | 12/1992 |
| JP | 6-204198 | * | 7/1994 |
| JP | A-07-241501 | | 9/1995 |

(Continued)

Primary Examiner—M. Kornakov
(74) Attorney, Agent, or Firm—Oliff & Berridge, PLC (57) ABSTRACT

A method for reducing energy consumption, and amounts of cleaning liquids and rinse liquids used. A cleaning head has a plurality of cleaning units and a drying unit. The organic, and inorganic, substance cleaning portions of each cleaning head, blows a first, and a second, cleaning agent selectively over a portion to be cleaned of a substrate, and sucks reaction products etc. through a first, and second, suction mouth, respectively. A rinse portion blows pure water over the portion of the substrate from which inorganic substances have been removed, and sucks its vapor through a third suction mouth. The drying unit dries the substrate by blowing out a heated gas from a hot wind blowing-out mouth. A light guide illuminates the portion to be cleaned, of the substrate, with ultraviolet light, and thereby decomposes residual organic substances.

5 Claims, 4 Drawing Sheets

FOREIGN PATENT DOCUMENTS

| | | |
|---|---|---|
| JP | A-08-264923 | 10/1996 |
| JP | A-10-092784 | 4/1998 |
| JP | 10242111 * | 9/1998 |
| JP | A-11-008213 | 1/1999 |
| JP | A-11-204259 | 7/1999 |
| JP | A-2000-349059 | 12/2000 |
| JP | A-2002-009037 | 1/2002 |

* cited by examiner

FIG. 1

12 : CLEANING HEAD  60 : DRYING UNIT
50 : CLEANING UNIT  61 : HOT WIND BLOWING-OUT MOUTH
52 : ORGANIC SUBSTANCE CLEANING PORTION
54 : INORGANIC SUBSTANCE CLEANING PORTION
56 : RINSE PORTION

PROCESSING-SUBJECT CLEANING METHOD AND APPARATUS, AND DEVICE MANUFACTURING METHOD AND DEVICE

BACKGROUND OF THE INVENTION

1. Field of Invention

The present invention relates to a method of cleaning a semiconductor substrate, a glass substrate or the like. In particular, the invention relates to a processing-subject cleaning method and apparatus suitable to clean a substrate on which patterns of circuit elements, interconnections, etc. are to be formed, and a device manufacturing method and a device.

2. Description of Related Art

In the related art, in forming patterns to provide circuit elements etc. on a substrate, such as a semiconductor substrate or a glass substrate, the patterns are formed after cleaning the substrate. This is because, for example, if organic or inorganic stains exist on the surface of a substrate, they may prevent or inhibit formation of patterns or impair the electrical characteristics of patterns formed. Usually, a substrate is cleaned by one of the following three processes, in each of which the cleaning efficiency is increased by controlling the temperature of a cleaning liquid (cleaning agent) to between 20° C. and 70° C.

The substrate is cleaned by using pure water or an organic solvent, and then dried.

After organic substances on the surface of the substrate are peeled off by using peeling liquid, inorganic substances are etched away with an acid solution, an alkaline solution or the like. Further, the substrate is rinsed with pure water, and then dried.

After the peeling-off of organic substances and the etching-away of inorganic substances of the above (2) are repeated certain times, the substrate is rinsed with pure water, and then dried.

SUMMARY OF THE INVENTION

In each of the above cleaning processes, in the related art, the substrate is immersed in a peeling liquid, an acid solution, an alkaline solution or the like as a cleaning liquid (cleaning agent). The substrate is immersed in a rinse liquid, or the entire substrate is rinsed with a rinse liquid. As such, in the related art cleaning, large amounts of cleaning liquids and rinse liquid are required because the entire substrate is cleaned. Further, in the related art cleaning, since the entire substrate is cleaned, stains, once removed by cleaning from portions where no patterns will be formed, may stick to pattern-forming portions, which makes it necessary to rinse off the stains stuck to the pattern-forming portions with a large amount of rinse liquid. Thus, the cleaning of substrates requires much time and a great cost and puts heavy loads on the environment. Furthermore, the related art cleaning consumes much energy to maintain prescribed temperatures of large amounts of cleaning liquids and rinse liquid. In addition, in the related art cleaning, large cleaning tanks capable of immersing the substrate come to be needed as the substrate becomes larger. And the substrate needs to be moved between each of cleaning tanks by a transport apparatus. Therefore, cleaning equipment (cleaning facilities) is large sized and requires a large installation space.

The present invention addresses or solves the above, and reduces the amounts of cleaning liquids and rinse liquid used as well as the energy consumption.

The invention also decreases the scale of facilities and thereby save the space.

To address or attain the above, a substrate cleaning method according to the invention includes: blowing a cleaning liquid selectively over a portion to be cleaned of a processing-subject by a liquid jetting device, sucking away the cleaning liquid, and drying the portion to be cleaned.

The invention, which is configured as above, can reduce the amount of cleaning liquid used to a large extent because the cleaning is performed by blowing the cleaning liquid selectively over only to the portion to be cleaned of the processing-subject, such as a substrate that needs to be cleaned. Further, since it is not necessary to keep constant the temperature of a large amount of cleaning liquid, the energy consumption can also be reduced.

A substrate cleaning method according to the invention includes: an organic substance removing step of removing an organic substance by blowing a first cleaning agent selectively over a pattern-forming portion of a processing-subject; an inorganic substance removing step of removing an inorganic substance by blowing a second cleaning agent selectively over the pattern-forming portion; a rinse step of blowing a rinse liquid selectively over the pattern-forming portion and removing the rinse liquid; and a drying step of drying a portion over which the rinse liquid was blown. At least one of the organic substance removing step, the inorganic substance removing step, and the rinse step is performed by a liquid jetting device.

This invention can reduce the amounts of cleaning liquids and rinse liquid used to a large extent because the cleaning is performed by blowing the first cleaning agent to remove organic substances, the second cleaning agent to remove inorganic substances, and the rinse liquid, selectively over only the pattern-forming portion that needs to be cleaned of the processing-subject, such as a substrate. Further, since no large cleaning tanks or substrate transport apparatus is needed even if the substrate (processing-subject) becomes large, the energy consumption and the amount of generation of liquid wastes can be reduced. For example, a peeling liquid to peel off an organic film or ozone water to oxidize organic substances can be used as the first cleaning agent. An etching liquid, such as an aqueous solution of HF, can be used as the second cleaning agent.

The rinse step may be executed after each of the organic substance removing step and the inorganic substance removing step has been executed plural times. This makes it possible to reliably remove difficult-to-remove stains that cannot be removed by a single cleaning operation.

The first cleaning agent may be a mixture of a first reactive gas, capable of reacting with the organic substance, and a first dissolving liquid, capable of dissolving the first reactive gas in itself. Employing, as the first cleaning agent, a mixture of the first reactive gas and the first dissolving liquid, that is, a gas/liquid mixture, makes it possible to supply a large amount of substance that reacts with organic substances, such as a substance that oxidizes organic substances, whereby organic substances can be removed more quickly. The second cleaning agent may be a mixture of a second reactive gas, capable of reacting with the inorganic substance, and a second dissolving liquid, capable of dissolving the second reactive gas in itself. This makes it possible to increase the amount of substance, which reacts with inorganic substances, to be used to etch inorganic substances, and thereby remove inorganic substances quickly.

The first cleaning agent may be a first reactive gas that is blown over the pattern-forming portion and can react with the organic substance, and a first dissolving liquid that is blown over the pattern-forming portion and can dissolve the first reactive gas in itself. This makes it possible to increase the amount of substance that reacts with organic substances. The second cleaning agent may be a second reactive gas that is blown over the pattern-forming portion and can react with the inorganic substance, and a second dissolving liquid that is blown over the pattern-forming portion and can dissolve the second reactive gas in itself. This makes it possible to increase the amount of supply of a substance that reacts with (i.e., etches) inorganic substances, and thereby increase the rate of removal of inorganic substances. Further, the nozzles etc. for jetting out liquids are prevented from being damaged by cleaning liquids (etching liquids) etc.

The drying may be performed by blowing a heated gas. Blowing a heated gas accelerates the evaporation of the rinse liquid, and thereby enables fast drying. Further, since the heated gas is blown over only the pattern-forming portion of the substrate, the energy that is consumed for the drying can be reduced to a large extent.

The gas may be a third reactive gas capable of oxidizing the organic substance. Performing the drying by heating the third reactive gas, such as a gas containing ozone or excited oxygen, and blowing it makes it possible to remove organic substances remaining on the substrate. An inert gas, such as nitrogen, may be used as the gas if necessary. Where the substrate is made of a material that is prone to oxidize, blowing an inert gas can prevent oxidation of the substrate, and thereby can maintain a clean state after cleaning reliably. Further, the drying may be performed while the pattern-forming portion is illuminated with ultraviolet light. Applying ultraviolet light makes it possible to decompose and remove organic substances remaining in the pattern-forming portion.

A cleaning apparatus according to the invention to provide the above processing-subject cleaning method includes: a cleaning head that is moved relative to a processing-subject; a moving device to move the cleaning head; a first jetting device provided in the cleaning head, to jet out a first cleaning agent capable of removing an organic substance; a first sucking device provided in the vicinity of the first jetting device, to suck the first cleaning agent; a second jetting device provided in the cleaning head, to jet out a second cleaning agent capable of removing an inorganic substance; a second sucking device provided in the vicinity of the second jetting device, to suck the second cleaning agent; a third jetting device provided in the cleaning head, to jet out a rinse liquid; a third sucking device provided in the vicinity of the third jetting device, to suck the rinse liquid; a drying device to dry the processing-subject; and a control device to control the moving device, the first jetting device, the second jetting device, and the third jetting device and thereby blowing the first cleaning agent, the second cleaning agent, and the rinse liquid selectively over a pattern-forming portion of the processing-subject.

This invention, configured as above, can reduce the amounts of cleaning liquids and rinse liquid used to a large extent because the first cleaning agent to remove organic substances, the second cleaning agent to remove inorganic substances, and the rinse liquid can be supplied, selectively and reliably, to the pattern-forming portion that needs to be cleaned of the substrate, and hence cleaning of unnecessary portions can be avoided. Further, since the cleaning is performed by moving the cleaning head, no large cleaning tanks or substrate transport apparatus is needed even if the processing-subject, such as a substrate becomes large. Therefore, the cleaning equipment (cleaning facilities) can be reduced in scale, and the space can be saved.

The first jetting device may include a first gas nozzle to jet out a first reactive gas capable of reacting with the organic substance, and a first liquid nozzle to jet out a first dissolving liquid capable of dissolving the first reactive gas in itself. This makes it possible to increase the amount of substance that reacts with organic substances such as a substance that oxidizes organic substances, whereby organic substances can be removed quickly. The second jetting device may include a second gas nozzle to jet out a second reactive gas capable of reacting with the inorganic substance, and a second liquid nozzle to jet out a second dissolving liquid capable of dissolving the second reactive gas in itself. This makes it possible to increase the amount of supply of a substance capable of etching inorganic substances, and prevent the liquid nozzles from being corroded (damaged) by cleaning liquids such as etching liquids.

The drying device may include an illuminating device to illuminate the pattern-forming portion with ultraviolet light. This makes it possible to decompose and remove organic substances by ultraviolet light when organic substances remain on the processing-subject.

A device manufacturing method according to the invention includes: removing unnecessary substances sticking to a surface of the processing-subject, by one of the processing-subject cleaning methods described above. This makes it possible to reduce the amounts of cleaning agents and the energy that is consumed by the cleaning, and to reduce loads on the environment accompanying with device manufacturing.

A device according to the invention manufactured by using one of the cleaning apparatuses described above. This makes it possible to reduce the amounts of cleaning agents and the energy that are consumed to manufacture the device, and to reduce loads on the environment and the device cost.

DETAILED DESCRIPTION OF PREFERRED EMBODIMENTS

Processing-subject cleaning methods and apparatuses, and device manufacturing methods and devices according to preferred exemplary embodiments of the present invention are described in detail below with reference to the accompanying drawings.

Figure 2:
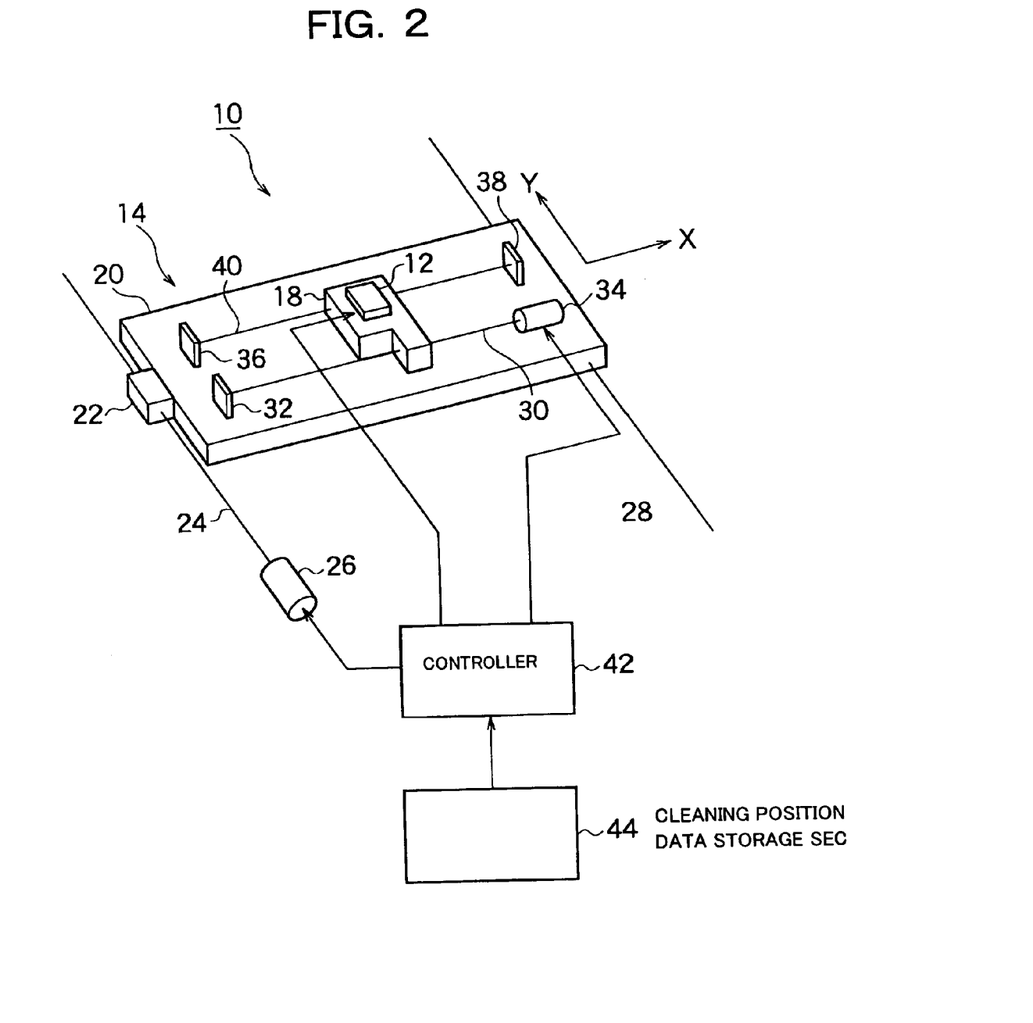
FIG. 2 is a perspective view, as viewed from below, of a significant part of a cleaning apparatus according to the first exemplary embodiment of the invention.

FIG. 2 is a perspective view, as viewed from below, of a significant part of a cleaning apparatus according to a first exemplary embodiment of the invention. As shown in FIG. 2, a cleaning apparatus 10 is equipped with a cleaning head 12, which is described in detail below. Mounted on what is referred to as an XY table 14, the cleaning head 12 can be moved parallel with the surface of a substrate of a semiconductor substrate, a glass substrate or the like (not shown in this figure), that is, the surface of a processing-subject.

The XY table 14 is composed of an X table 18 and a Y table 20 on which the X table 18 is mounted. A cleaning head 12 is fixed to the X table 18, and a liquid storage unit (not shown) in which a cleaning liquid, a rinse liquid, etc. is stored, is mounted on the X table 18. On the other hand, mounted on a Z table (not shown), the Y table 20 can be moved together with the Z table in the vertical direction that is perpendicular to the surface of the Y table 20. A nut unit 22 that is provided at one end of the Y table 20 is threadedly engaged with a ball-thread screw 24.

One end of the ball-thread screw 24 is rotatably supported by a bracket that is provided on the Z table. The other end of the ball-thread screw 24 is connected to a Y servo motor 26 that is provided on the Z table. A guide bar 28 that is provided on the Z table slidably penetrates through the other end portion of the Y table 20. The guide bar 28 is disposed parallel with the ball-thread screw 24. Therefore, the Y table 20 is moved in the Y direction along the ball-thread screw 24 when the ball-thread screw 24 is rotated by driving the Y servo motor 26.

A ball-thread screw 30 is provided on the Y table 20 so as to extend in the X direction that is perpendicular to the ball-thread screw 24. The ball-thread screw 30 is threadedly engaged with the X table 18. One end of the ball-thread screw 30 is rotatably supported by a bearing 32 that is attached to the Y table 20, and the other end is connected to an X servo motor 34 that is attached to the Y table 20. The X servo motor 34, the Y servo motor 26, the X table 18, the Y table 20, etc. constitute a moving device to move the cleaning head 12 parallel with the surface of a substrate.

A guide bar 40 is provided on the Y table 20 via brackets 36 and 38 parallel with the ball-thread screw 30. Slidably penetrating through one end portion of the X table 18, the guide bar 40 guides the X table 18 in the X direction while preventing rotation of the X table 18. Therefore, the X table 18 is moved in the X direction along the ball-thread screw 30 when the ball-thread screw 30 is rotated by driving the X servo motor 34.

The Y servo motor 26, the X servo motor 34, and the cleaning head 12 are connected to a controller 42 that is a control device, and are drive-controlled by the controller 42. A cleaning position data storage section 44, in which positions of portions to be cleaned, are stored is also connected to the controller 42. The controller 42 reads out data stored in the cleaning position data storage section 44, and selectively cleans prescribed portions of a substrate by moving the cleaning head 12 parallel with the substrate surface and controlling the operation of the cleaning head 12.

Figure 3:
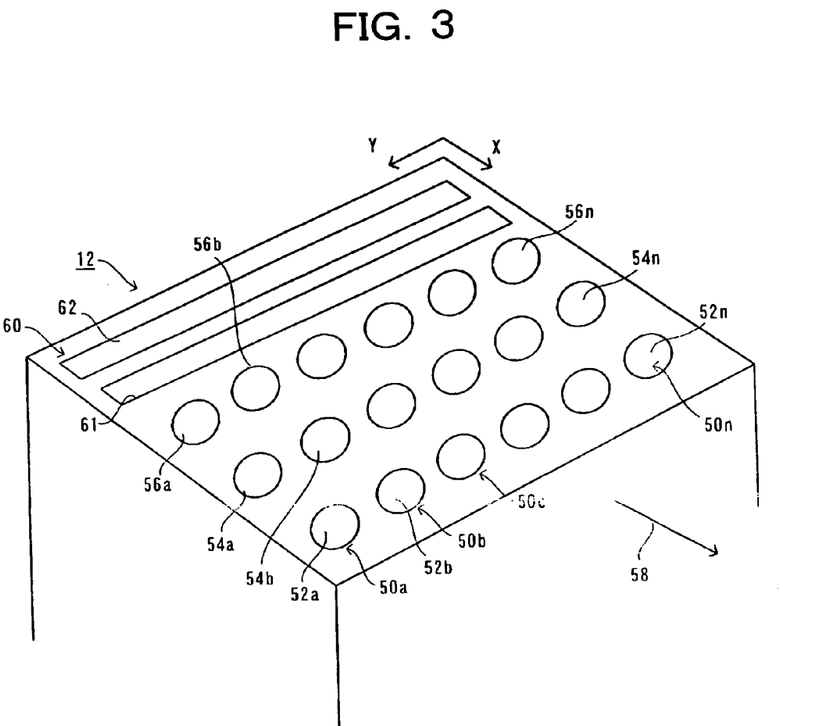
FIG. 3 is a schematic perspective view of a significant part of the cleaning head according to the first exemplary embodiment.

As shown in FIG. 3, the cleaning head 12 has a plurality of cleaning units 50 (50a to 50n), which, in this exemplary embodiment, are arranged in the Y direction at regular intervals. Although FIG. 3 shows the cleaning head 12 having six cleaning units, the invention is not limited to such a case.

Each cleaning unit 50 has an organic substance cleaning portion 52 (52a to 52n), an inorganic substance cleaning portion 54 (54a to 54n), and a rinse portion 56 (56a to 56n), each of which is described in detail below. The organic substance cleaning portion 52, the inorganic substance cleaning portion 54, and the rinse portion 56 are arranged in this order straightly in the X direction that is the moving direction of the cleaning head 12 during cleaning, as indicated by arrow 58 in FIG. 3. The cleaning head 12 is formed with a hot wind blowing-out mouth (wind blowing mouth) 61 of a drying unit 60 as a drying device in the rear of the cleaning units 50. In this exemplary embodiment, the hot wind blowing-out mouth 61 assumes a rectangle whose long sides extend in the Y direction and has such a length as to cover the range where the cleaning units 50 are provided. Although in this exemplary embodiment a hot wind is blown out of the blowing mouth, the invention is not limited to such a case; a device capable of drying a subject by blowing an ordinary-temperature wind over it may also be used.

The drying unit 60 is also provided, in the rear of the hot wind blowing-out mouth 61, with a light guide 62 that is an illuminating device. The tip (illumination mouth) of the light guide 62 extends in the Y direction like the hot wind blowing-out mouth 61, whereby the light guide 62 can illuminate, with ultraviolet light, a portion of a substrate over which a hot wind coming from the hot wind blowing-out mouth 61 is blown.

Figure 1:
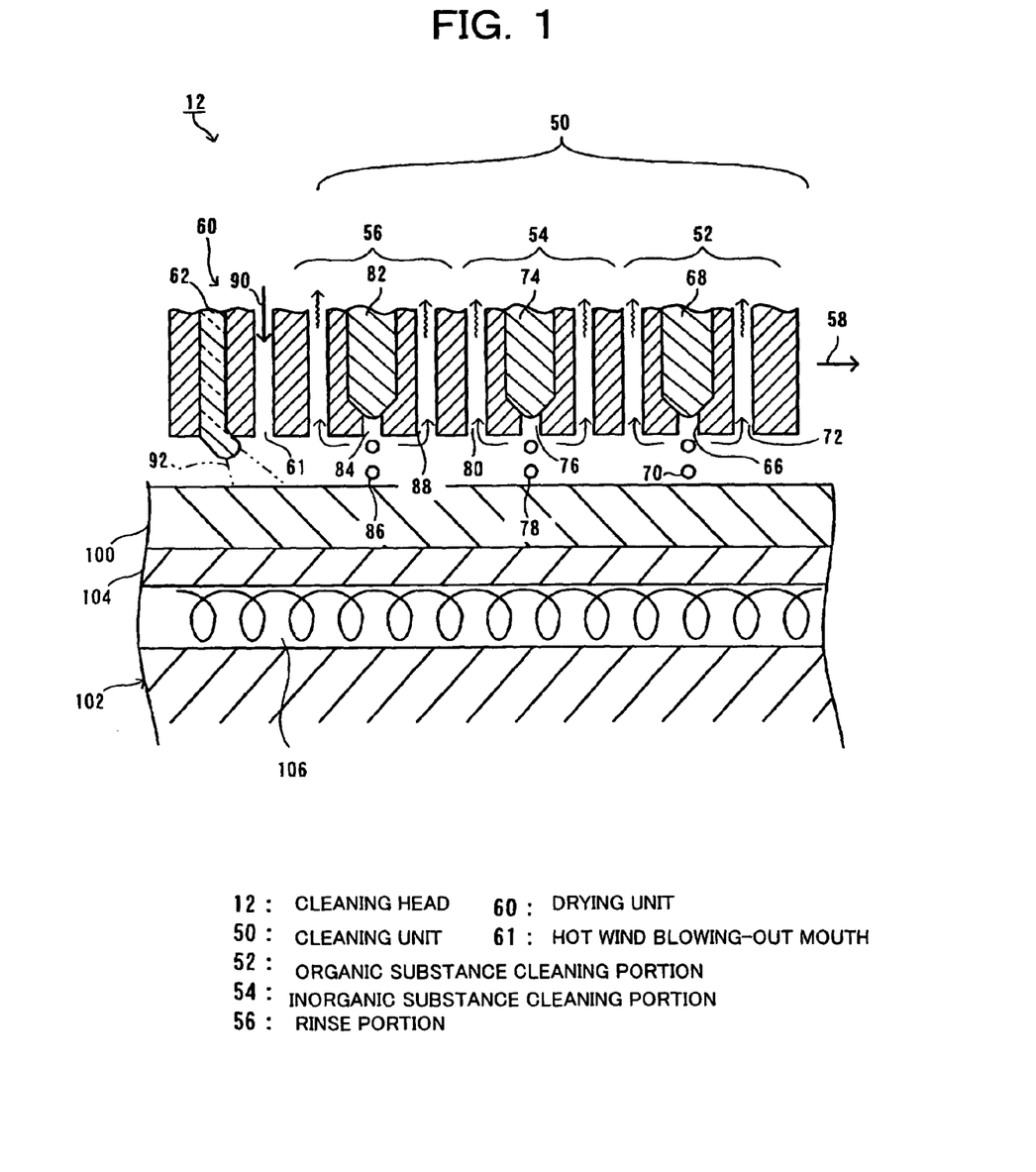
FIG. 1 is a partial sectional view of a cleaning head according to a first exemplary embodiment of the present invention.

The organic substance cleaning portion 52, the inorganic substance cleaning portion 54, and the rinse portion 56 of the cleaning head 12 are configured as shown in FIG. 1. That is, the tip portion of each of the organic substance cleaning portion 52, the inorganic substance cleaning portion 54, and the rinse portion 56 has a double-tube structure. The organic substance cleaning portion 52 is provided with a first nozzle 66 that constitutes a first jetting device. A first cleaning agent 68, such as an organic substance peeling liquid, ozone water or the like, capable of peeling off organic substances, is jetted out of the first nozzle 66 in the form of fine particles 70, whereby the first cleaning liquid 68 can be blown over at a prescribed position of a substrate 100. In the organic substance cleaning portion 52 of the cleaning head 12, a first suction mouth (first sucking device) 72 is provided around the first nozzle 66. The first suction mouth 72 sucks reaction products of a reaction between organic substances on the surface of the substrate 100 and the first cleaning agent 68, jetted out of the first nozzle 6 and being blown over the surface of the substrate 100 as a processing-subject, 6, and the first cleaning agent 68 transpiring from the surface of the substrate 100.

Provided with a second nozzle (second jetting device) 76 that jets out a second cleaning agent 74, such as a hydrofluoric acid solution, the inorganic substance cleaning portion 54 blows fine particles 78 of the second cleaning agent 74 over the surface of the substrate 100. In the inorganic substance cleaning portion 54, a second suction mouth (second sucking device) 80 is formed around the second nozzle 76. The second suction mouth 80 sucks reaction products of a reaction between inorganic substances on the surface of the substrate 100 and the second cleaning agent 74, a vapor of the second cleaning agent 74 evaporating from the surface of the substrate 100, and other substances.

Having a third nozzle (third jetting device) 84 that jets out pure water 82 as a rinse liquid, the rinse portion 56 blows fine particles 86 of the pure water 82 over the surface of the substrate 100. Provided around the third nozzle 84, a third suction mouth (third sucking device) 88 can suck a vapor of the pure water 82 evaporating from the surface of the substrate 100.

In this exemplary embodiment, liquid jetting devices as jetting devices to jet out the fine particles 70, 78, and 86 of the first cleaning agent 68, the second cleaning agent 74, and the pure water 82 from the first nozzle 66, the second nozzle 76, and the third nozzle 84 are configured in the same manner as in a printer head of an ink jet printer, and are constant amount jetting mechanisms capable of jetting out constant amounts of fine particles 70, 78, and 86 by use of piezoelectric elements or the like. In this exemplary embodiment, the fine particles 70, 78, and 86 that are jetted out of the respective nozzles 66, 76, and 84 have diameters approximately in a range of 10 to 100 μm, and hence can easily evaporate. The liquid jetting device that can be used in the invention is not limited to the ink jetting head using piezoelectric elements; a thermal ink jet type head utilizing thermal expansion, and a head utilizing electrostatic attraction may also be used.

As described below, the hot wind blowing-out mouth 61 of the drying unit 60 dries the surface of the substrate 100 by accelerating evaporation of the pure water 82 by blowing a heated gas 90, such as heated air, to a portion of the substrate 100 over which the pure water 82 was blown. The light guide 62, the illuminating device, illuminates ultraviolet light 92 emitted from an ultraviolet lamp (not shown) to a portion of the substrate 100 over which the heated gas 90 is blown, and thereby decomposes residual organic substances.

On the other hand, in a table 102 on which the substrate 100 is mounted, a table main body 104 incorporates a heater 106 that is a heating device. The substrate 100 is heated to a prescribed temperature (e.g., 30° C. to 60° C.), whereby the removal reactions involving the cleaning agents 68 and 74 are accelerated, and the evaporation of the cleaning agents 68 and 74 remaining on the surface of the substrate 100 is also made faster.

The above-configured cleaning apparatus 10 according to the embodiment operates in the following manner.

The substrate 100 to be cleaned is placed on the table 102 and heated to a prescribed temperature by the heater 106. Position of portions to be cleaned of the substrate 100 are stored in the cleaning position data storage section 44. For example, the portions to be cleaned are portions of the substrate 100 corresponding to what is called pattern-forming positions where circuit elements, interconnections, etc. will be formed.

Upon activation of the cleaning apparatus 10, the controller 42 as the control device moves the cleaning head 12 to a prescribed initial position via the XY table 14. Then, the controller 42 reads the positions of the portions to be cleaned from the cleaning position data storage section 44, moves the cleaning head 12 in the X direction as indicated by arrow 58 in FIG. 3 by driving the X servo motor 34, and stops the organic substance cleaning portions 52 of the cleaning head 12 at a position corresponding to a portion to be cleaned (pattern-forming position) of the substrate 100. Then, the controller 42 operates each first jetting device so that it jets out the first cleaning agent 68, such as a peeling liquid or ozone water, in the form of fine particles 70 from the first nozzle 66, and blows the first cleaning agent 68 over the portion to be cleaned of the substrate 100. At this time, the controller 42 does not operate the jetting device of part of the organic substance cleaning portions 52 that do not correspond to the portion to be cleaned of the substrate 100. As a result, only the pattern-forming portion of the substrate 100 that needs be cleaned is cleaned, and the portions, where pattern is not formed and no need of cleaning, are not cleaned.

The fine particles of the first cleaning agent 68, being blown over the surface of the substrate 100, peel off organic substances on the substrate surface, or react with the organic substances to oxidize those. Organic substances that have been peeled off from the substrate surface, or reaction products of a reaction between the first cleaning agent 68 and organic substances, and a vapor of the first cleaning agent 68 are sucked into the first suction mouth 72, and thereby removed from the surface of the substrate 100 and its vicinity. Further, in this exemplary embodiment, since the substrate 100 is heated to the prescribed temperature by the heater 106 which is incorporated in the table 102, the peeling of organic substances, and the reaction between organic substances and the first cleaning agent 68 are accelerated, and the evaporation of the first cleaning agent 68 remaining on the surface of the substrate 100 is made faster, leaving no influences on the subsequent cleaning of inorganic substances.

Where the cleaning region of the substrate is wide and the cleaning head 12 needs to be moved also in the Y direction, the controller 42 moves the cleaning head 12 in the Y direction via the Y table 20 by driving the Y servo motor 26.

After causing the organic substance cleaning portions 52 to perform the cleaning to remove organic substances for a prescribed time, the controller 42 moves the cleaning head 12 in the X direction, and stops the inorganic substance cleaning portions 54 at the position corresponding to the portion to be cleaned of the substrate 100 from which organic substances have been removed by the organic substance cleaning portions 52. The controller 42 operates the jetting mechanism of a second jetting device so that it jets out fine particles 78 of the second cleaning agent 74 from the second nozzle 76, and blows the second cleaning agent 74 over the surface of the substrate 100. The second cleaning agent 74 reacts with unnecessary inorganic substances stuck to the surface of the substrate 100 and etches them away. Reaction products of a reaction between the second cleaning agent 74 and inorganic substances, and a vapor of the second cleaning agent 74 that have evaporated from the surface of the substrate 100, are sucked into the second suction mouth and thereby removed. The controller 42 does not operate part of the inorganic substance cleaning portions 54 that correspond to the organic substance cleaning portions 52 that did not jet out the first cleaning agent 68.

After causing the inorganic substance cleaning portions 54 to perform the cleaning to remove inorganic substances for a prescribed time, the controller 42 moves the cleaning head 12 further in the X direction, and stops the rinse portions 56 at the position corresponding to the portion to be cleaned of the substrate 100 from which inorganic substances have been removed. The controller 42 operates the jetting mechanism of a third jetting device so that it blows pure water 82 over the surface of the substrate 100, thereby to rinse the portion to be cleaned of the substrate 100 from which inorganic substances have been removed. The pure water 82, blown over the substrate 100 in the form of fine particles 86, is evaporated by heat of the substrate 100 being heated and is sucked into the third suction mouth 88.

After completion of the rising with the pure water 82, the controller 42 moves the cleaning head 12 further in the X direction, and stops the hot wind blowing-out mouth 61 as the drying device at the position corresponding to the portion to be cleaned of the substrate 100 that have been rinsed. A heated gas 90 such as heated air is blown from the hot wind blowing-out mouth 61 over the portion to be cleaned of the substrate 100 so as to dry the surface of the substrate 100 completely, and the cleaning of this portion is finished. During the drying with the heated gas 90, the portion to be cleaned of the substrate 100 over which the heated gas 90 is blowing is illuminated with ultraviolet light 92 via the light guide 62, whereby residual organic substances are removed.

After completion of the cleaning of the region of the substrate 100 having a prescribed width in the X direction, the controller 42 shifts the cleaning head 12 in the Y direction by a prescribed distance and then returns it to the cleaning start position. The substrate 100 is then cleaned in the same manner as described above.

As described above, in this exemplary embodiment, only portions that should be cleaned of the substrate 100 are cleaned. Therefore, a cleaning agent (cleaning liquid) is saved, and the amount of use of pure water 82 necessary to rinse can be reduced to a large extent.

Further, since the substrate 100 is cleaned by moving the cleaning head 12, no large cleaning tanks or transport apparatus is needed even if the size of the substrate 100 is increased. As a result, the installation space can be made very small, and the energy to maintain a prescribed temperature of a cleaning agent can be reduced greatly.

Although the above exemplary embodiment is described in the case that the heated gas 90 is air, an inert gas, such as a heated nitrogen gas, may be used as the heated gas 90 in the case where it is desired to prevent oxidation of the substrate 100 after cleaning. As another alternative, residual organic substances may be removed by using a heated gas containing ozone or radical oxygen as the heated gas 90. Although in the above exemplary embodiment, ultraviolet light 92 is illuminated to the portion of the substrate 100 over which the heated gas 90 is being blown, the illumination of ultraviolet light 92 may be performed on a portion (pattern-forming portion) that needs to be cleaned and is not the potion over which the heated gas 90 is being blown. Although the above exemplary embodiment is described in the case that the rinse liquid is water, the rinse liquid may be another liquid such as alcohol. In the cleaning head 12, if necessary, a heat insulation member may be disposed around the flow path of the heated gas 90. The first cleaning agent 68, the second cleaning agent 74, and the pure water 82 may be jetted out after being heated to desired temperatures. Although the above exemplary embodiment is described in the case that the substrate 100 is heated by the heater 106, a modification is possible in which the substrate 100 is not heated and a cleaning liquid etc. remaining on the surface of the substrate 100 are sucked away in a liquid state. Although the above embodiment is described in the case that the light guide 62 radiates ultraviolet light 92 from the front side of the cleaning head 12, an ultraviolet lamp or the like may be provided on the front side of the cleaning head 12.

The above exemplary embodiment is described in the case that organic substances and inorganic substances are removed by the first cleaning agent 68 and the second cleaning agent 74, and then rinsing with the pure water 82 is performed. However, the invention can also be applied to a case that cleaning is performed by using only pure water or an organic solvent. In this case, it is sufficient for the cleaning head 12 to have one of the organic substance cleaning portions 52, the inorganic substance cleaning portions 54, or the rinse portions 56. Although the above embodiment is described in the case that the first cleaning agent 68 is an organic peeling liquid or ozone water, it may be a mixture of ozone water and ozone. Although the above exemplary embodiment is directed in the case that the second cleaning agent 74 is an aqueous solution of hydrofluoric acid, it may be a mixture of an aqueous solution of hydrofluoric acid and hydrogen fluoride (HF), or a mixture of chlorine water and chlorine.

Figure 4:
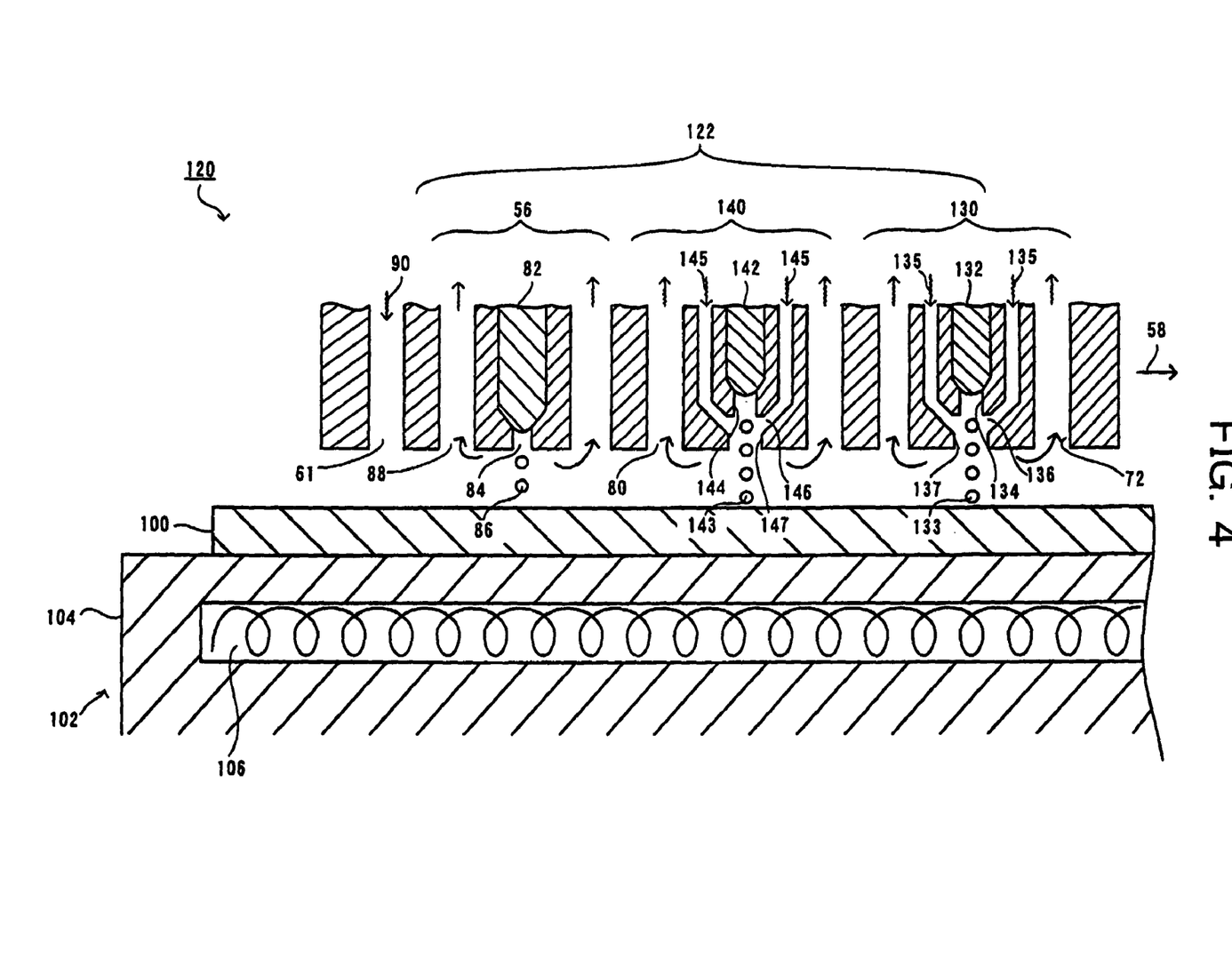
FIG. 4 is a sectional view of a cleaning head according to a second exemplary embodiment of the invention.

FIG. 4 illustrates an important part of a cleaning apparatus according to a second exemplary embodiment of the invention and is a sectional view of a cleaning head. The cleaning head 120 according to the exemplary embodiment has a plurality of cleaning units 122, and a hot wind blowing-out mouth 61. Each cleaning unit 122 is composed of an organic substance cleaning portion 130, an inorganic substance cleaning portion 140, and a rinse portion 56 that are arranged in this order in a moving direction of the cleaning head 12 which is indicated by arrow 58.

The tip portion of the organic substance cleaning portion 130 assumes a triple-tube structure, in which a first liquid nozzle 134 for jetting out a first dissolving liquid 132, such as pure water, in the form of fine particles 133, is provided at the center portion. In the organic substance cleaning portion 130, a first gas nozzle 136, to jet out a first reactive gas 135 such as ozone capable of oxidizing organic substances, is provided around the first liquid nozzle 134. The first gas nozzle 136 has an opening in front of the tip of the first liquid nozzle 134. A first jetting mouth 137 is provided in front of the tip of the first gas nozzle 136. The fine particles 133 of the first dissolving liquid 132, and the first reactive gas 135 are jetted through the first jetting mouth 137, and blown over the surface of a substrate 100. A first suction mouth 72 is provided around the first jetting mouth 137 to make it possible to suck away reaction products and a vapor of the first dissolving liquid 132.

The inorganic substance cleaning portion 140 is configured in the same manner as the organic substance cleaning portion 130. A second liquid nozzle 144, to jet out a second dissolving liquid 142, such as pure water or alcohol, in the form of fine particles 133, is provided at the center portion. A second gas nozzle 146 is provided around the second liquid nozzle 144 and jets a second reactive gas 145, such as HF or $Cl_2$ capable of reacting with inorganic substances, to the portion in front of the second liquid nozzle 144. A second jetting mouth 147 is provided in front of the tip of the second gas nozzle 146. The fine particles 143 of the second dissolving liquid 142 and the second reactive gas 145 can be jetted through the second jetting mouth 147 and blown over the surface of the substrate 100. A second suction mouth 80, through which to suck away reaction products and a vapor of the second dissolving liquid 142, is provided around the second jetting mouth 147.

Jetting mechanisms to jet out the fine particles 133 and 143 from the first liquid nozzle 134 and the second liquid nozzle 144 are configured in the same manner as in a printer head of an ink jet printer, and are constant amount jetting mechanisms using piezoelectric elements or the like. The rinse portion 56 is configured in the same manner as in the above exemplary embodiment. Although not shown in FIG. 4, a light guide to radiate ultraviolet light may be provided in the same manner as in the above exemplary embodiment.

In the above-configured second exemplary embodiment, the controller 42 moves the organic substance cleaning portions 130 of the cleaning units 122 to a position corresponding to a portion to be cleaned of the substrate 100 via the XY table 14. Then, the controller 42 controls the jetting mechanism of first liquid nozzle 134 to jet out the first dissolving liquid 132, such as pure water, in the form of fine particles 133, and opens an opening/closing valve (not shown) to jet out the first reactive gas 135, such as ozone, from the first gas nozzle 136. The fine particles 133 of the first dissolving liquid 132 that are jetted out of the first liquid nozzle 134 collide with the surface of the substrate 100 while dissolving part of the first reactive gas 135 in itself, and ionizes and activates it and thereby allows it to react with organic substances.

Reaction products produced by this reaction and a vapor of the first dissolving liquid 132 are sucked through the first suction mouth 72 and thereby removed from the surface of the substrate 100.

Upon completion of the cleaning to remove organic substances by the organic substance cleaning portions 130, the controller 42 moves the cleaning head 120 in the direction indicated by arrow 58, and stops the inorganic substance cleaning portions 140 at the position corresponding to the portion to be cleaned of the substrate 100. Then, the controller 42 operates each second liquid nozzle to jet out the second dissolving liquid 142, such as pure water or alcohol, in the form of fine particles and operates each second gas nozzle 146 to jet out the second reactive gas 145 such as HF. The second dissolving liquid 142 dissolves part of the second reactive gas 145 in itself. The fine particles 143 and the second reactive gas 145 are jetted out of the second jetting mouth 147 and collide with the surface of the substrate 100. During that course, the second reactive gas 145 dissolves in the fine particles 143 and is ionized, and thereby reacts with and etches inorganic substances existing on the surface of the substrate 100. Resulting reaction products and a vapor of the second dissolving liquid 142 are sucked away through the second suction mouth 80.

Although the above exemplary embodiment is described in the case that the reactive gases 135 and 145 are jetted from around the respective liquid nozzles 134 and 144, each of the reactive gases 135 and 145 may be jetted from one side of the liquid nozzle 134 or 144. It is preferable that the tip portions of the cleaning heads 12 and 122 be covered with a fluorocarbon resin film to prevent them from being corroded by cleaning agents.

The cleaning method and apparatus according to the invention can be applied to manufacturing methods of such devices as color filters, organic EL (electro luminescence) devices, and semiconductor devices. That is, the application of the invention is preferable in the case where manufacturing methods of devices of the above kind include a step of cleaning a substrate-to-be-processed.

For example, the cleaning method and apparatus according to the invention can be applied to a case of cleaning, such as dust, unnecessary organic and inorganic substances, etc. adhered on a substrate, such as a glass substrate or banks, before or after formation of the banks when R, G, and B inks are formed on the substrate by a liquid jetting device in color filter manufacture.

The cleaning method and apparatus according to the invention can also be applied as desired to manufacturing processes of other devices in the case where a cleaning step is necessary. What can be cleaned by the cleaning method and apparatus according to the invention are not limited to substrates, and they can also be applied to cleaning of other processing-subjects.

As described above, according to the invention, since only portions of a substrate that need to be cleaned are cleaned selectively, the amounts of cleaning liquids and rinse liquid used can be reduced to a large extent, and the energy consumption can also be reduced.

What is claimed is:

1. A processing-subject cleaning method, comprising:
moving a liquid jetting device parallel with a surface of a processing-subject, so as to clean only a portion of the processing-subject;
consecutively blowing a plurality of differing cleaning liquids selectively over the portion of the processing-subject by the liquid jetting device;
rinsing the cleaning liquids from the processing-subject;
sucking away a first reaction product by a first suction mouth,
wherein the first suction mouth is disposed adjacent to a first nozzle;
sucking away a second reaction product by a second suction mouth,
wherein the second suction mouth is disposed adjacent to a second nozzle; and
drying the portion of the processing-subject, the drying being performed while a pattern-forming portion is illuminated with ultraviolet light.

2. The processing-subject cleaning method according to claim 1, the drying being performed by blowing a heated gas.

3. The processing-subject cleaning method according to claim 2, the gas being a third reactive gas capable of oxidizing the organic substance.

4. The processing-subject cleaning method according to claim 2, the gas being an inert gas.

5. A device manufacturing method, comprising;
removing unnecessary substances sticking to a surface of the processing-subject by the processing-subject cleaning method according to claim 1.

* * * * *